(12) United States Patent
Park et al.

(10) Patent No.: US 10,748,771 B2
(45) Date of Patent: Aug. 18, 2020

(54) APPARATUS FOR PROCESSING A SUBSTRATE AND DISPLAY DEVICE BY USING THE SAME

(71) Applicant: LG Display Co., Ltd., Seoul (KR)

(72) Inventors: Jeong Kweon Park, Paju-si (KR); Jeong Joon Lee, Daejeon (KR); Ju Ik Hong, Gumi-si (KR); Sang Chul Lee, Paju-si (KR); Jangcheol Kim, Paju-si (KR); Ik Hyun Kuon, Chilgok-gun (KR); Tagyoung Choi, Paju-si (KR); Jinwook Kwak, Busan (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/283,392

(22) Filed: Feb. 22, 2019

(65) Prior Publication Data

US 2019/0189448 A1    Jun. 20, 2019

Related U.S. Application Data

(63) Continuation of application No. 15/640,951, filed on Jul. 3, 2017, now Pat. No. 10,276,383.

(30) Foreign Application Priority Data

Jul. 12, 2016    (KR) .......................... 10-2016-0088276

(51) Int. Cl.
*H01L 21/20* (2006.01)
*H01L 31/18* (2006.01)
(Continued)

(52) U.S. Cl.
CPC .......... *H01L 21/2007* (2013.01); *B24B 19/02* (2013.01); *B26F 1/16* (2013.01); *H01L 21/02063* (2013.01); *H01L 31/182* (2013.01)

(58) Field of Classification Search
None
See application file for complete search history.

(56) References Cited

U.S. PATENT DOCUMENTS

| 2005/0084349 A1* | 4/2005 | Kammerer | ............ E21B 10/485 408/204 |
| 2005/0186042 A1* | 8/2005 | Hansson | ................. B23B 51/02 408/231 |

(Continued)

FOREIGN PATENT DOCUMENTS

| CN | 1617974 A | 5/2005 |
| CN | 100455390 C | 1/2009 |

(Continued)

*Primary Examiner* — Zandra V Smith
*Assistant Examiner* — Lawrence C Tynes, Jr.
(74) *Attorney, Agent, or Firm* — Seed IP Law Group LLP

(57) ABSTRACT

Disclosed herein is an apparatus for processing a substrate that forms a hole in a substrate while reducing a burr in the hole so that a module device can be inserted into the hole to reduce the thickness of a display device, and the display device using the apparatus. The apparatus for processing the substrate comprises a body configured to operably be rotatable, and a cylindrical cutting tip at an end of the body. The bottom surface of the cutting tip is in an acute angle with respect to a contact surface of the substrate to allow formation of a groove at the substrate.

5 Claims, 9 Drawing Sheets

(51) Int. Cl.
*H01L 21/02* (2006.01)
*B24B 19/02* (2006.01)
*B26F 1/16* (2006.01)

(56) References Cited

U.S. PATENT DOCUMENTS

2009/0007436 A1\* 1/2009 Daskal .................... B26B 21/58
  30/346
2011/0159319 A1 6/2011 Yamasaki et al.

FOREIGN PATENT DOCUMENTS

| CN | 101904766 A | 12/2010 | | |
|---|---|---|---|---|
| CN | 106601869 A | 4/2017 | | |
| JP | 2011-150779 A | 8/2011 | | |
| JP | 2014-183101 A | 9/2014 | | |
| KR | 10-1373421 B1 | 3/2014 | | |
| KR | 10-1534770 B1 | 7/2015 | | |
| KR | 101534770 | \* | 7/2015 | ................ B26F 1/16 |

\* cited by examiner

APPARATUS FOR PROCESSING A SUBSTRATE AND DISPLAY DEVICE BY USING THE SAME

CROSS-REFERENCE TO RELATED APPLICATIONS

This application claims the priority of Korean Patent Application No. 2016-0088276 filed on Jul. 12, 2016, in the Korean Intellectual Property Office, the disclosure of which is incorporated herein by reference.

BACKGROUND

Technical Field

The present disclosure relates to an apparatus for processing a substrate and a display device using the same, and in detail, to an apparatus for processing a substrate for forming a hole, and a display device using the same.

Description of the Related Art

As the era of information technology has truly begun, the field of display devices has been rapidly grown up that represents information contained in electrical signals in the form of visual images. In accordance with this, research is ongoing into various flat panel display devices which are thinner and lighter and consume less power. Flat panel display devices include a liquid-crystal display (LCD) device, a plasma display panel (PDP) device, a field emission display (FED) device, an electro-wetting display (EWD) device, and an organic light-emitting display (OLED) device, etc.

Beyond simply displaying images, display devices provide various features such as making a call, listening to music, taking a picture and so on, thereby adding more to users' convenience. In order to incorporate various features into a display device, it is required to build a module device having various functions in the display device. However, as such module devices are built in a display device, the weight and thickness of the display device may increase. Therefore, what is required is a technology to reduce the weight and thickness of display devices.

BRIEF SUMMARY

In order to incorporate a module device having various features in a display device, a hole is formed in the substrate constituting the panel. To form a hole in the substrate, a groove is formed conforming to the hole, and the portion of the substrate inside the groove is removed. Since the depth of the groove is smaller than the thickness of the substrate, the portion of the substrate under the groove is broken when it is removed, such that the hole is formed. However, when the portion of the substrate under the groove is broken, it may not be removed such that debris of the substrate remains inside the groove, or the portion of the substrate outside the groove may be broken. What the debris of the substrate remains inside the groove or the portion of the substrate outside the groove is broken is a defect. When the defect happens, a rework process has to be carried out. The debris of the substrate may be referred to as a burr. In the following description, the two terms may be used interchangeably.

As the size of the bezel of display devices become gradually smaller, the size of the hole for accommodating a module device has almost no margin of design values for the size of the module device.

In view of the above, the inventors of the application have appreciated that above-described problems and have devised an apparatus for processing a substrate for forming a hole exactly as designed.

An object of the present disclosure is to provide an apparatus for processing a substrate for forming a groove in a substrate to form a hole having values as designed.

It is another object of the present disclosure to provide an apparatus for processing a substrate capable of suppressing the size of debris of a substrate inside a groove when removing the portion of the substrate inside the groove formed therein.

It is yet another object of the present disclosure to provide a display device having a module device built in the hole formed by using the apparatus for processing the substrate.

It is still another object of the present disclosure to provide a method for forming a hole in a substrate using the apparatus for processing the substrate.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

According to an embodiment of the present disclosure, there is provided a cutting apparatus for forming a hole in a substrate comprising a rotatable body, and a cutting tip at an end of the body. The cutting tip having an inner surface, an outer surface, and a bottom surface between the inner surface and the outer surface, the bottom surface having an acute angle with respect to a contact surface of the substrate, when the body is positioned perpendicular to the contact surface of the substrate, to allow formation of a groove in the substrate. Accordingly, it is possible to reduce the size of debris of the substrate that may be created during a process of removing a core substrate inside the groove formed in the substrate.

According to another embodiment of the present disclosure, there is provided an apparatus for processing a substrate for forming a groove in a substrate, the apparatus comprising a cutting unit for forming the groove in the substrate. The cutting unit includes a first inclined surface and a second inclined surface, and an end portion at an intersection of the first inclined surface and the second inclined surface, in operation, the end portion contacts the substrate with the cutting unit positioned perpendicular to the substrate. Accordingly, it is possible to reduce the size of debris of the substrate that may be created during a process of removing a core substrate inside the groove formed in the substrate.

According to yet another embodiment of the present disclosure, there is provided a display device comprising a substrate having a display area and a non-display area, and at least one opening in at least one of the display area and the non-display area. The opening is formed by a cutting tip of an apparatus for processing a substrate, and the cutting tip includes a shape that, in operation, forms an acute angle with respect to a contact surface of the substrate. Accordingly, it is possible to reduce the size of the debris of the substrate that may be created inside the hole, and to reduce the thickness of the display device by inserting a module device into the hole.

Particulars of the embodiments of the present disclosure will be described in the detail description with reference to the accompanying drawings.

According to embodiments of the present disclosure, an apparatus for processing a substrate for forming a groove in a substrate includes a cutting tip, and a bottom surface of the cutting tip has a non-flat shape, to allow the substrate to be broken on the outer side of the groove. Accordingly, it is possible to minimize the substrate from not being broken such that debris of the substrate remains inside the hole.

In addition, according to the embodiments of the present disclosure, a cutting tip for forming a groove in a substrate is composed of two or more separate pieces forming a circle, instead of a single piece, thereby allowing debris or foreign matter that may be created during a process of forming the groove to exit.

Further, according to the embodiments of the present disclosure, a cutting tip for forming a groove in a substrate includes a first inclined surface positioned on the inner side of the cutting tip and forming an acute angle, and further includes a third inclined surface extending from the first inclined surface and having a larger inclined angle than the first inclined surface. Accordingly, the cutting tip is supported by it to disperse the force, and it is possible to avoid the cutting tip from being broken when forming the groove.

It is to be understood that both the foregoing general description and the following detailed description are exemplary and explanatory and are intended to provide further explanation of the inventive concepts as claimed.

BRIEF DESCRIPTION OF THE SEVERAL VIEWS OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
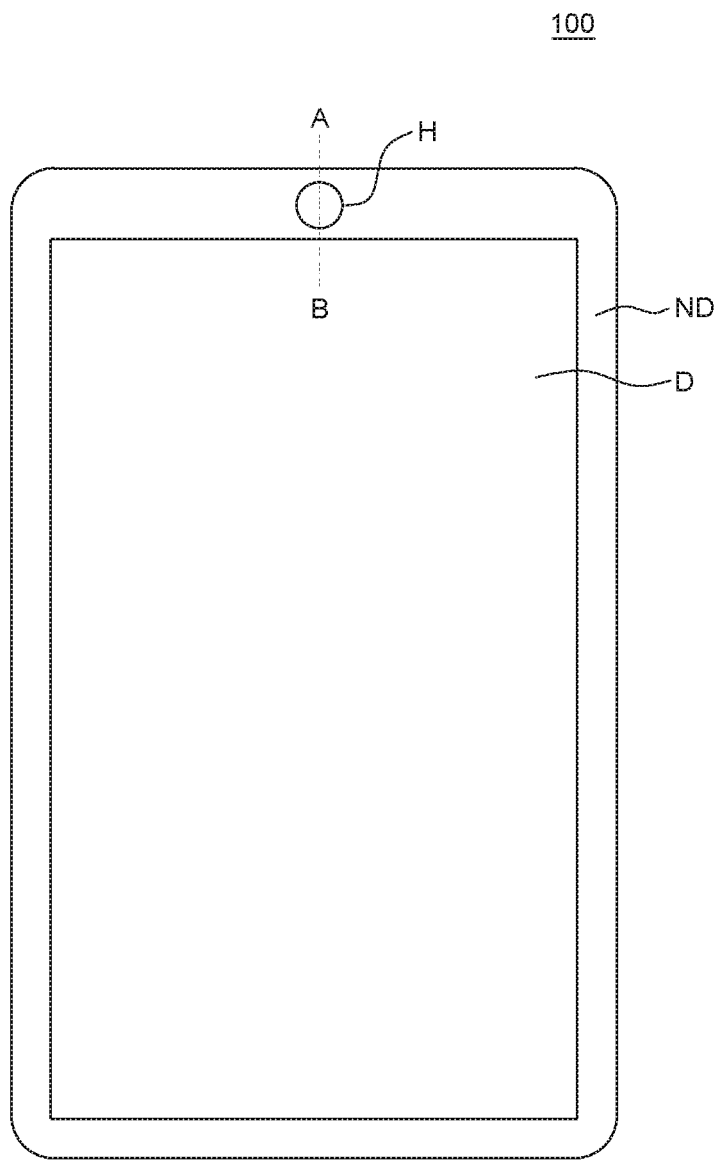
FIG. 1 is a plan view illustrating a panel provided by a method for processing a substrate according to an embodiment of the present disclosure.

Advantages and features of the present disclosure and methods to achieve them will become apparent from the descriptions of embodiments hereinbelow with reference to the accompanying drawings. However, the present disclosure is not limited to embodiments disclosed herein but may be implemented in various different ways. The embodiments are provided for making the disclosure of the present disclosure thorough and for fully conveying the scope of the present disclosure to those skilled in the art. It is to be noted that the scope of the present disclosure is defined only by the claims.

The figures, dimensions, ratios, angles, the numbers of elements given in the drawings are merely illustrative and are not limiting. Like reference numerals denote like elements throughout the descriptions. Further, in describing the present disclosure, descriptions on well-known technologies may be omitted in order not to unnecessarily obscure the gist of the present disclosure. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g., "a," "an," "the," this includes a plural of that noun unless specifically stated otherwise.

In describing elements, they are interpreted as including error margins even without explicit statements.

In describing positional relationship, such as "an element A on an element B," "an element A above an element B," "an element A below an element B," and "an element A next to an element B," another element C may be disposed between the elements A and B unless the term "directly" or "immediately" is explicitly used.

In describing temporal relationship, terms such as "after," "subsequent to," "next to" and "before" are not limited to "directly after," "directly subsequent to," "immediately next to" "immediately before," and so on, unless otherwise specified.

The terms first, second, third and the like in the descriptions and in the claims are used for distinguishing between similar elements and not necessarily for describing a sequential or chronological order. These terms are used to merely distinguish one element from another. Accordingly, as used herein, a first element may be a second element within the technical idea of the present disclosure.

Features of various embodiments of the present disclosure may be combined partially or totally. As will be clearly appreciated by those skilled in the art, technically various interactions and operations are possible. Various embodiments can be practiced individually or in combination.

Hereinafter, an apparatus for processing a substrate according to embodiments of the present disclosure will be described with reference to the accompanying drawings.

FIG. 1 is a view illustrating a panel provided by a method for processing a substrate according to an embodiment of the present disclosure.

A panel 100 may be used in various display devices such as a liquid-crystal display device, a plasma display device, a field emission display device, an electrophoretic display device, an electro-wetting display device, and an organic light-emitting display device. The panel 100 may be composed of a single substrate or two substrates and may include a substrate formed of glass. The panel 100 includes a display area D including pixels displaying images, and a non-display area ND where no image is displayed, other than the display area D. The non-display area ND may also be referred to as a bezel. The bezel may have a very small or no width. The display area may be included in at least one of a liquid-crystal display panel, an organic light-emitting display panel, and an electrophoretic panel.

In some panels, a hole H may be formed in the non-display area ND to incorporate a camera, a microphone, a speaker, a sensor module, an illumination module, an infrared ray module, a button, a drive IC and other I/O (input/output) devices, for example. By forming a hole H in the display area D, various features can be realized.

The hole H may be formed by forming a groove at a desired position of a substrate for a panel using an apparatus for processing a substrate, and then removing the part of the substrate inside the groove. The hole H may be referred to as an opening, and the part of the substrate inside the groove may be referred to as a core substrate. In the following description, they may be used interchangeably.

Figure 2A:
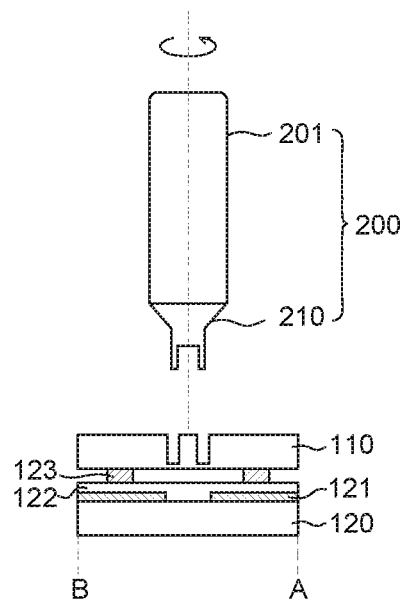
FIG. 2A is a cross-sectional view showing a step of forming a groove in a panel by an apparatus for processing a substrate.

FIG. 2A is a view showing a process for forming a groove in a panel by an apparatus for processing a substrate having a drill 200. FIG. 2A is a cross-sectional view of the panel taken along line A-B of FIG. 1. The panel may include a first substrate 110 and a second substrate 120, and a groove may be formed in the first substrate 110, for example. The drill 200 may be disposed perpendicular to the first substrate 110 and the second substrate 120 and may be rotated to grind the substrate.

On the first substrate 110, thin-film transistors may be formed to drive the pixels. On the second substrate 120, a black matrix 121, a color filter and an insulating layer 122 may be disposed to cover the black matrix 121. Column spacers 123 may be disposed between the first substrate 110 and the second substrate 120 around the hole. As the second substrate 120 comes in contact with the column spacers 123, the rigidity of the portion around the hole is maintained, and damage to the layers disposed on the second substrate 120 can be prevented, which is caused when the first substrate 110 is sagged due to the weight of the drill 200 during the step of forming the hole with the drill 200.

Although FIG. 2A illustrates the liquid-crystal panel, the method of forming the hole using the drill 200 is equally applicable to an electrophoretic panel and an organic light-emitting display panel formed of a single substrate.

The first substrate 110 may be formed of a material which may be ground by diamond, such as glass. The second substrate 120 may be formed of an insulating material and may be a flexible film formed of, but is not limited to, glass, polyimide, acryl, polyacrylate, polycarbonate, polyether, sulfonic acid, silicon oxide (SiOx).

And, the second substrate 120 may include various layers for forming a color filter substrate, an encapsulation substrate for a display, a cover substrate and/or a touch substrate. Each of the first substrate 110 and the second substrate 120 may be a display panel, a cover substrate, and/or a touch substrate. Alternatively, each of the first substrate 110 and the second substrate 120 may be a cover substrate and/or a touch substrate, and a display panel.

The drill 200 may include a cutting tip 210 capable of forming a groove in the first substrate 110, and a body 201 for fixing the cutting tip 210. The cutting tip may be connected to an end of the body. The cutting tip 210 may have a variety of sizes depending on the size of the module device to be built in the panel. As the cutting tip 210 rotates, a circular groove may be formed in the first substrate 110. The depth of the groove is smaller than the thickness of the first substrate 110. A sensor for measuring thickness may be additionally required to measure the thickness of the first substrate 110 and to control the depth of the groove. By drilling the groove as deep as possible in the first substrate 110, it is easier to remove the core substrate.

The cutting tip may be referred to as a cutting unit or a wheel.

If the groove is formed until the thickness of the portion of the first substrate 110 in the groove is less than 10 μm, a pressing force is applied to the first substrate 110 by the drill 200 such that the first substrate 110 may be collapsed. As a result, the second substrate 120 or the layers formed on the second substrate 120, such as the black matrix 121, the color filter layer, and the insulating layer 122, may be damaged. In particular, if the black matrix 121 is damaged, light around the hole cannot be blocked and thus light leakage may occur.

That is, the hole is formed by forming the groove and then removing the core substrate, because the insulating layer disposed below the groove may be damaged if the hole is directly drilled with the drill 200 in the first substrate 110, as described above.

Accordingly, it is desired that the thickness of the grooved portion of the first substrate 110 is equal to or greater than 10 μm. However, the thickness of the grooved portion of the substrate may be smaller depending on the type of the panel and thickness of the substrate.

Figure 2B:
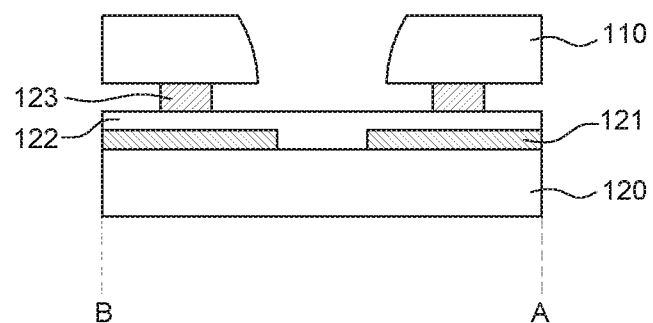
FIG. 2B is a cross-sectional view showing a panel after a hole has been formed.

FIG. 2B is a view showing a panel after a hole has been formed. After the groove is formed in the panel, a step of removing the core substrate is carried out. After the core substrate is removed, the first substrate 110 has a hole. The circumference around the hole formed in the first substrate 110 is inclined and has a shape as grinded by the outer surface of the cutting tip 210. In addition, the black matrix 121 disposed on the second substrate 120 is exposed via the hole, such that it is possible to block or prevent light from leaking around the hole. Accordingly, the module device disposed in the hole is less visible by viewers, allowing for simpler appearance of the display device.

In the following description, the first substrate 110 having the hole is referred to as a substrate, and the second substrate 120 facing the first substrate 110 is referred to as a lower substrate, for convenience of illustration.

Figure 3:
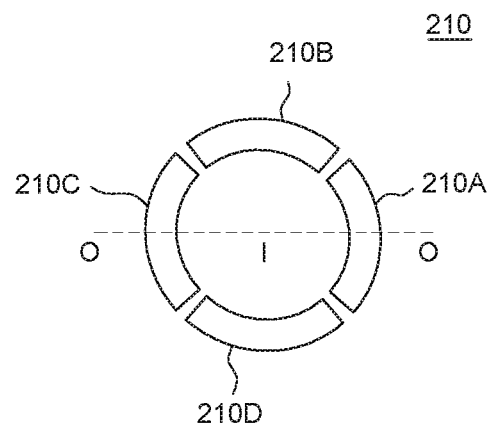
FIG. 3 is a bottom view of the cutting tip of the drill shown in FIG. 2A.

FIG. 3 is a bottom view of the cutting tip of the drill 200 of FIG. 2A. FIG. 3 schematically shows the cutting tip 210. The shape of the cutting tip 210 will be described with reference to FIG. 4.

The cutting tip 210 has a circular shape but is not a single continuous piece when viewed from the bottom of the tip. The cutting tip 210 is partially divided to form a circle. That is, the cutting tip 210 may include arc-like cutting portions so as to form a circular groove in the substrate. In detail, a first cutting portion 210A, a second cutting portion 210B, a third cutting portion 210C and a fourth cutting portion 210D are disposed adjacent to one another to form the circular cutting tip 210. The first cutting portion 210A is spaced apart from the second cutting portion 210B and the fourth cutting portion 210D by a gap, the second cutting portion 210B is spaced apart from the first cutting portion 210A and the third cutting portion 210C by the gap, the third cutting portion 210C is spaced apart from the second cutting portion 210B and the fourth cutting portion 210D by the gap, and the fourth cutting portion 210D is spaced apart from the third cutting portion 210C and the first cutting portion 210A by the gap. By using the cutting tip 210 having the gaps, foreign matters or debris occurred during the step of forming the groove in the substrate can easily be eliminated, to prevent the foreign matter or debris from disturbing the process of forming the groove. Accordingly, the cutting tip 210 may include the gaps along the circumferential surface of the cutting tip 210, such that debris from the grinding of the substrate along the circumferential surface may be eliminated via the gaps. The foreign matters and debris can easily be eliminated via the gaps to thereby prevent the foreign matters or debris from disturbing the process of forming the groove.

Figure 4:
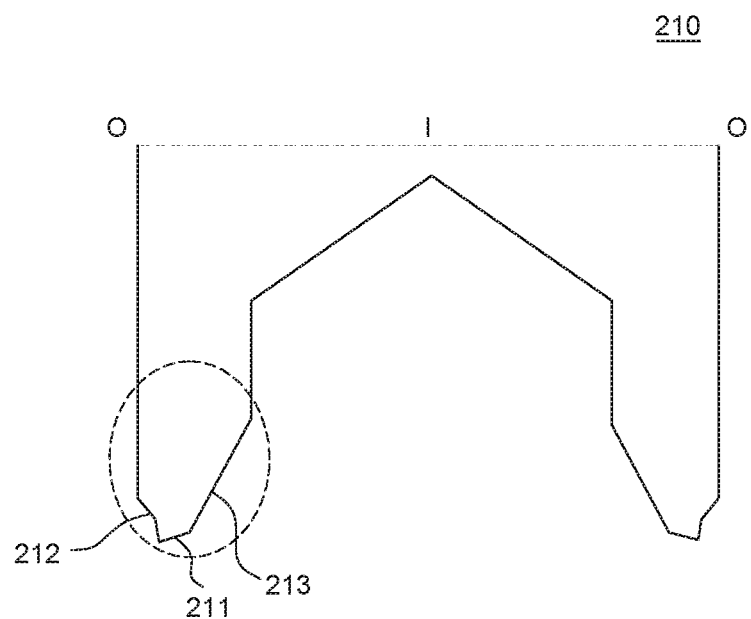
FIG. 4 is a cross-sectional view of the cutting tip taken along line O-I-O of FIG. 3.

FIG. 4 is a cross-sectional view of the cutting tip taken along line O-I-O of FIG. 3. Although FIG. 4 shows the cross section of the first cutting portion 210A and the third cutting portion 210C, the second cutting portion 210B and the fourth cutting portion also have the same shape. As shown in FIG. 4, an end portion of the cutting tip 210 corresponding to the first cutting portion 210A has a sharp shape, and has a first inclined surface 211 and a third inclined surface 213 which are an inner surface of the cutting tip 210, and a second inclined surface 212 which is the outer surface. The first inclined surface 211 may be referred to as the bottom surface of the cutting tip 210. The bottom surface of the cutting tip 210 is not flat with respect to the contact surface of the substrate on which the groove is to be formed. The first inclined surface 211 meets the second inclined surface 212 to form the sharp shape of the end portion of the cutting tip 210.

The third cutting portion 210C is symmetric with the first cutting portion 210A, and the end portion of each of the third cutting portion 210C and the first cutting portion 210A is formed outward so that the grinding force is concentrated on the outer side of the cutting tip 210.

The central portion of the cutting tip 210 has a space, such that the space can accommodate debris of the substrate occurred during the step of grinding the substrate with the drill. That is, there may be a space for accommodating the debris of the substrate in the center portion of the cutting tip 210. The space may be referred to as an inner recess.

Figure 5A:
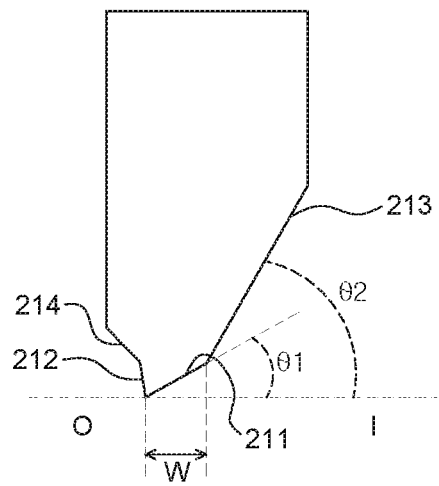
FIG. 5A is an enlarged cross-sectional view of portion O-I of the cutting tip of FIG. 4 according to a first embodiment.

FIG. 5A is an enlarged cross-sectional view of portion O-I of the cutting tip according to a first embodiment.

The cutting unit or cutting tip 210 has a shape that is not flat with respect to the contact surface of the substrate and thus can form a groove or opening. The cutting unit or cutting tip 210 includes the first inclined surface 211 and the second inclined surface 212. The first inclined surface 211 meets the second inclined surface 212 such that they are not flat with respect to the substrate, thereby forming the end portion of the cutting tip 210.

The first inclined surface 211 is located on the inner side of the cutting tip 210 and forms an acute angle with respect to the substrate. In detail, the first inclined surface 211 forms the angle of θ1 with respect to the substrate. The first inclined surface 211 may form a groove in the substrate so that it has a predetermined width W. The width W of the first inclined surface 211 may affect the size of a burr created during the step of removing the core substrate. For example, the greater the width W of the first inclined surface 211 is, the greater the size of the burr is, and vice versa. The size of the hole to be formed in the panel differs depending on the type of the display device or the type of the module device to be accommodated in the hole. For a small hole, if the size of the burr is too large, it may not be able to accommodate the module device into the hole. And, when the module device is accommodated into the hole, the burr may be broken to damage the module device. Therefore, in order to reduce the size of the burr, it is desired to make the width W of the first inclined surface 211 as small as possible.

Accordingly, the first inclined surface 211 is extended from the bottom surface of the cutting tip 210 and inclined at a larger angle than the bottom surface. The first inclined surface 211 is inclined with respect to the substrate at the angle of θ1. For example, the bottom surface of the cutting tip forms the angle of θ1 with respect to the contact surface of the first substrate 110. The first inclined surface 211 comes in contact with the second inclined surface 212 forming the outer surface of the cutting tip 210 and forms the end portion of the cutting tip 210. The second inclined surface 212 is inclined toward the outer side of the cutting tip 210. And, the first inclined surface 211 and the second inclined surface 212 meet at the contact surface with the substrate. The inclined angle θ1 of the first inclined plane 211 and the inclined angle of the second inclined plane 212 form acute angles with respect to the first substrate 110, respectively. The sharp end portion of the cutting tip makes it easy to form the groove in the first substrate 110.

The cutting tip 210 may include the third inclined surface 213 that is extended from the first inclined surface 211 to form the angle of θ2 larger than the angle of θ1. The third inclined surface 213 supports the first inclined surface 211 and disperses the force concentrated at the end portion of the cutting tip 210 where the first inclined surface 211 meets the second inclined surface 212, such that it is possible to prevent the end portion of the cutting tip 210 from being broken. In addition, by forming the third inclined surface 213, the width W of the first inclined surface 211 can be maintained, and it is possible to prevent the position where the substrate is to be broken during the step of removing the core substrate from moving more to the inside of the groove.

That is, by forming the third inclined surface 213 extending from the first inclined surface 211 at the cutting tip 210, it is possible to prevent the end portion of the cutting tip 210 from being broken and to reduce the size of the burr. Such effects achieved by the third inclined surface 213 may become larger as the angle θ1 of the first inclined surface 211 is smaller.

The surface that is connected to the bottom surface of the cutting tip and located on the outer side of the cutting tip 210 may have a recessed shape or a concave shape. For example, the second inclined surface 212, which forms an outer side of the cutting tip 210, may be extended to form a fourth inclined surface 214, and the second inclined surface 212 and the fourth inclined surface 214 may be connected to each other smoothly. The fourth inclined surface 214 may be extended from the second inclined surface 212 to form a curve with the second inclined surface 212. And the fourth inclined surface may be referred to as a recessed surface. The boundary portion between the second inclined surface 212 and the fourth inclined surface 214 has a recessed shape or a concave shape slightly bent toward the inner side of the cutting tip 210. Accordingly, when the groove is formed in the substrate, the portion having the groove forms a taper and is smoothly ground, so that the substrate chips can be prevented from falling.

The surface of the cutting tip 210 may be coated with a mixture of diamond particles and a deposition material. As the cutting tip 210 is used to drill holes in many substrates, the deposition material on the surface of the cutting tip 210 may be worn, such that the diamond particles may be exposed. Without the fourth inclined surface 214, the diamond particles exposed from the surface of the cutting tip may collide with the portion of the substrate outside the groove during the process of grinding a groove, such that the substrate may be broken. To avoid this, the fourth inclined surface 214 is formed that is smoothly extended from the second inclined face 212, such that the outside substrate of the groove is gently ground, thereby preventing the substrate from being broken.

Figure 5B:
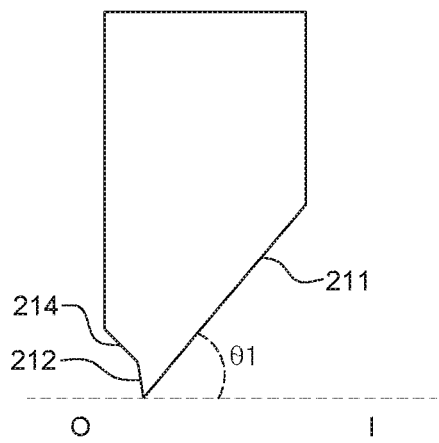
FIG. 5B is an enlarged cross-sectional view of portion O-I of the cutting tip of FIG. 4 according to a second embodiment.

FIG. 5B is an enlarged cross-sectional view of the cutting tip according to a second embodiment, which is an enlarged view of portion O-I of FIG. 4. In FIG. 5B, the third inclined surface 213 is omitted. As described above, as the angle θ1 of the first inclined surface 211 is increased, the effects achieved by the third inclined surface 213 becomes smaller, which prevent the end portion of the cutting tip from being broken and reduce the size of the burr. In particular, if the angle θ1 of the first inclined surface 211 is 45° or higher, for example, the third inclined surface 213 may be omitted. As the angle θ1 of the first inclined surface 211 increases, the end portion of the cutting tip becomes sharper, so that the breaking position of the first substrate 110 can be concentrated at the end portion of the cutting tip.

Although the surfaces of the cutting tip may be formed by plating the surfaces with diamond as mentioned above, this is merely illustrative. The material of the surface of the cutting tip may vary depending on the material of the substrate. There is a trade-off between the lifespan of the cutting tip and the angle θ1 of the first inclined surface 211. The larger the angle θ1 of the first inclined surface 211 is, the shorter the lifespan of the cutting tip becomes, and vice versa. However, as the angle θ1 of the first inclined surface 211 is smaller, burrs are more likely to be created, and thus the yield may decrease. Therefore, the angle θ1 of the first inclined surface 211 has to be adjusted by considering the trade-off between the lifespan and the yield. In addition, the hardness of the surface of the cutting tip may need to be improved.

In addition, the size of the hole may vary depending on the type of the display device. Therefore, different factors are to be considered for different sizes of holes. For example, as the hole size decreases, the lifespan of the cutting tip increases, and thus the angle θ1 of the first inclined surface 211 of the cutting tip may be increased to improve the yield.

Figure 6A:
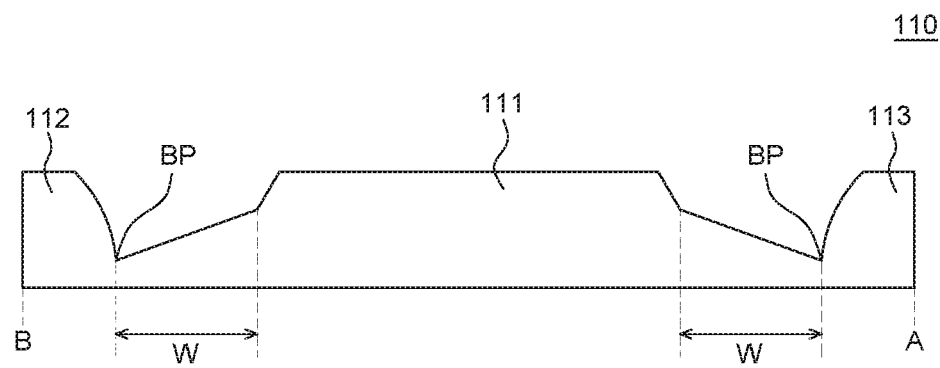
FIG. 6A is a cross-sectional view of the substrate in which a groove has been formed by an apparatus for processing a substrate.

FIG. 6A is a cross-sectional view of the substrate 110 in which a groove has been formed by an apparatus for processing a substrate with the cutting tip having the shape according to the first embodiment, shown in FIG. 5A. The end portion of the cutting tip where the first inclined surface 211 meets the second inclined surface 212 forms a breaking point BP on the substrate 110. The breaking point BP refers to a position where the substrate 110 is broken when the core substrate 111, i.e., the portion of the substrate inside of the groove is removed in order to form a hole. The probability increases that the substrate 110 is broken at the breaking point BP as the width W of the first inclined surface is smaller and the angle θ1 of the first inclined surface is larger. This is because the bottom surface of the cutting tip has an angle so that the thickness of the substrate 110 is thinnest at the breaking point BP. Therefore, when the groove is formed by rotating the cutting tip having a sharp end portion, the breaking point BP may be formed along the circumference of the groove.

The inner surfaces 112 and 113 of the substrate 110 in which the hole is formed, i.e., the outer surfaces of the hole may be tapered so that it has a smooth shape, conforming to the shape of the second inclined surface 212 and the fourth inclined surface 214 of the cutting tip.

Figure 6B:
FIG. 6B is a cross-sectional view of the substrate in which a hole has been formed by removing the core substrate shown in FIG. 6A.

FIG. 6B is a cross-sectional view of the substrate 110 in which a hole has been formed by removing the core substrate shown in FIG. 6A. In FIG. 6B, the left portion of the substrate is referred to as the left substrate 112 while the right portion thereof is referred to as the right substrate 113 for convenience of illustration.

The right substrate 113 has been formed as designed without leaving a burr since the substrate 110 was broken at the breaking point BP. The taper is formed by the shape of the cutting tip and has the taper width 115, and the taper does not affect the size of the hole.

The left substrate 112 has a burr as the actual breaking point BP has been moved toward the core substrate 111. The burr can occupy the inside of the hole. If the burr is too large, it may not be able to insert a module device into the hole. Thus, the burr width 114 may be determined based on the margin of the hole size relative to the size of the module device. Since the size of the bezel of the display device is decreasing recently, so is the margin. Accordingly, the burr width 114 may also be reduced. The burr width 114 may be, but is not limited to, approximately 150 μm or less.

Figure 7:
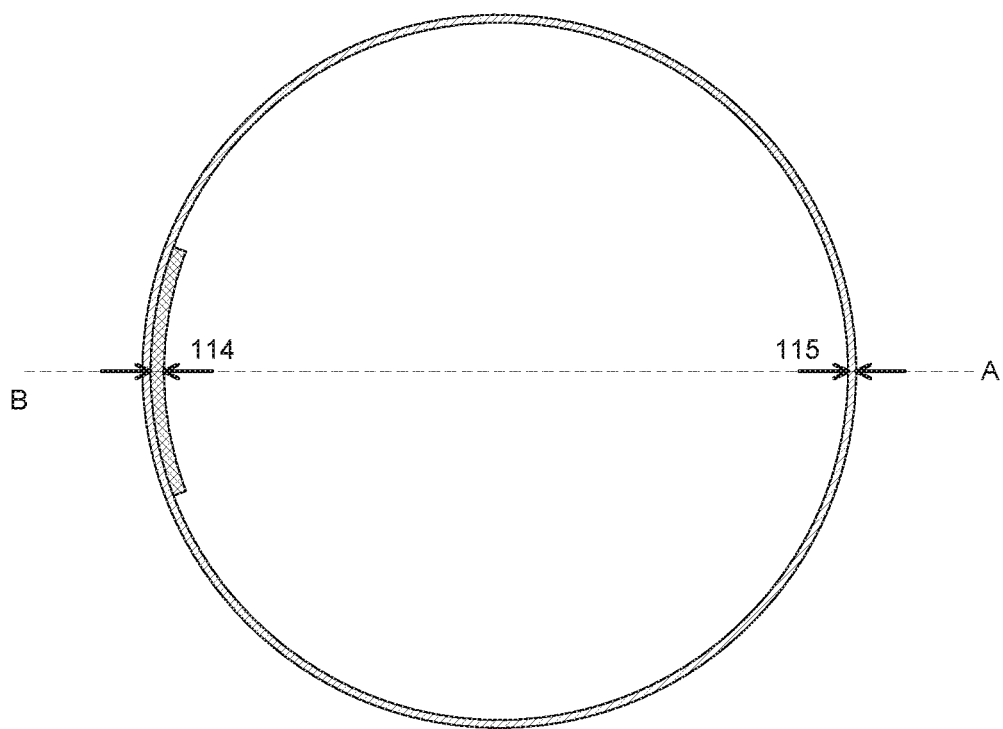
FIG. 7 is a top view of the substrate of FIG. 6B.

FIG. 7 is a top view of the substrate 110 of FIG. 6B after the circular hole has been formed. The hole having a taper width 115 is formed in the substrate 110. As shown in FIG. 6B, no burr is formed in a region corresponding to the right substrate 113 but a burr is formed in a region corresponding to the left substrate 112. The burr formed in the hole may have various shapes. The burr width 114 may not be constant in one burr and the largest burr width 114 is considered as a reference.

The shape, position and size of the burr shown in FIGS. 6B and 7 are merely illustrative, and the shape, position and size of the burr may vary. Ideally, a hole has no burr.

Hereinafter, the position of the burr depending on the shape of the cutting tip will be described.

Figure 8A:
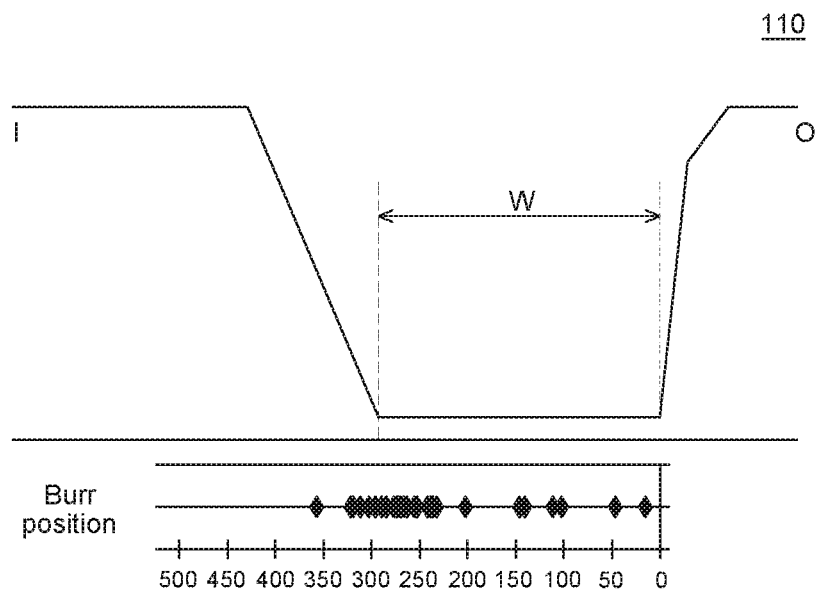
FIGS. 8A to 8C are cross-sectional views of substrates when grooves are formed in the substrates using cutting tips having a flat bottom, the slope of 15° and the slope of 45°, respectively, along with the positions of burrs when the core substrates have been removed.
Figure 8B:
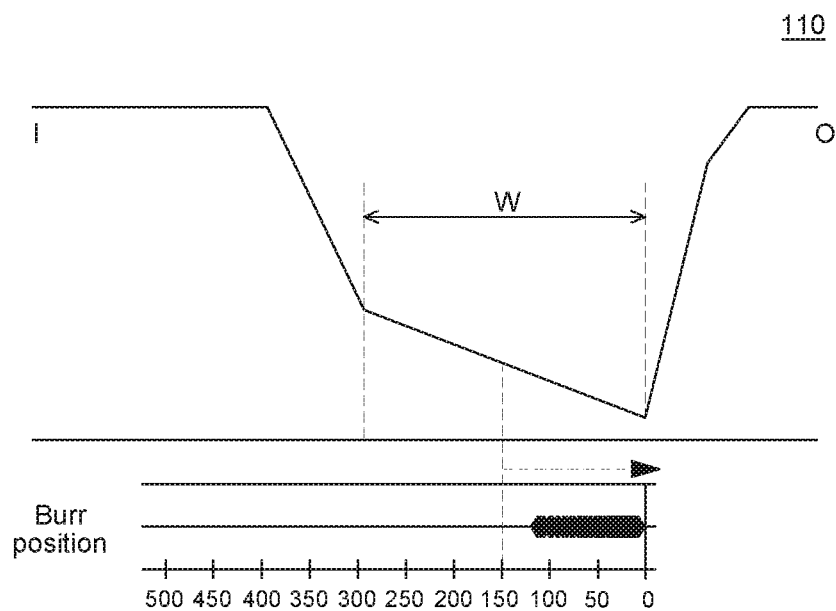
Figure 8C:
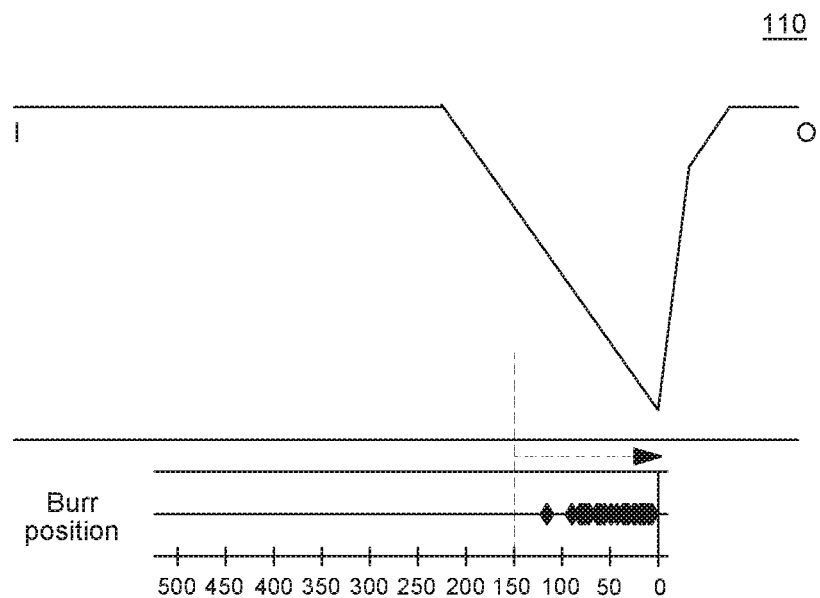

FIGS. 8A to 8C are cross-sectional views of substrates when grooves are formed in the substrates using cutting tips having a flat bottom surface, a slope of 15° with respect to the contact surface of the substrate, and a slope of 45° with respect to the contact surface of the substrate, respectively, along with the positions of burrs when the core substrates have been removed. The positions of the burrs will be described with reference to Table 1.

TABLE 1

| Cutting tip | | Burr size (μm) | | |
|---|---|---|---|---|
| W | slope | ≤50 | 50 < burr ≤ 150 | 150> |
| 300 μm | Flat | 3.3% | 13.3% | 83.4% |
| | 15° | 51.0% | 43.5% | 5.5% |
| | 45° | 57.1% | 35.4% | 7.5% |
| 500 μm | 15° | 50.0% | 47.0% | 3.0% |

FIG. 8A is a cross-sectional view of the substrate 110 when the groove is formed in the substrate using the cutting tip having a flat bottom surface. The width W of the bottom surface of the cutting tip is 300 μm, and the thickness of the portion of the substrate 110 corresponding to the bottom surface having the width W is constant. The thinnest portion of the substrate 110 is also corresponding to all portion of the width W, and thus the possibility that the substrate 110 is broken is equal throughout the bottom surface having the width W. Referring to the burr position graph indicating the size of the burr, the rhombuses indicating the breaking points are distributed from the inner side (I) of the groove to the outer side (O) of the groove, and are especially concentrated on the inner side of the groove. Since the portion of the substrate on the inner side of the groove is to be removed, the size of the burr can be reduced as the breaking point is formed more on the outer side (O) of the groove. Referring to Table 1, burrs having a size of 150 μm or more account for 83.4%, which is the largest portion. That is, when a groove is formed in the substrate 110 using the cutting tip having the flat bottom surface, the breaking point of the substrate 110 may be formed between approximately 150 μm and 370 μm from the outer side (O) of the groove.

FIG. 8B is a cross-sectional view of the substrate 110 when the groove is formed in the substrate using the cutting tip having the bottom surface with the inclination angle of 15°. The width of the bottom surface of the cutting tip is 300 μm. The thickness of the substrate 110 is smaller on the outer side than in the inner side within the width W of the bottom surface. The groove formed in the substrate 110 by the cutting tip with the third inclined surface has an angle larger than 15° from the position distant from the outer side O of the groove by 300 μm, such that the thickness of the substrate 110 is drastically increased. As a result, it is possible to prevent the portion of the substrate 110 distant from the outer side O of the groove by 300 μm from being broken. Referring to the burr position graph, the rhombuses are concentrated on the outer side O of the groove. In particular, the rhombuses are concentrated within the distance between 0 μm to 150 μm. Accordingly, the substrate 110 is highly likely to be broken within the distance between 0 μm to 150 μm. That is, the size of the burr may be 150 μm or less. Referring to Table 1, burrs having a size of 0 to 50 μm account for 51%, and burrs having a size of 50 to 150 μm account for 43.5%. Therefore, the burr having a size of 150 μm or less accounts for 94.5%. In other words, when the groove is formed in the substrate by using the cutting tip having the bottom surface with the inclination angle of 15°, the size of the burr can be reduced to 150 μm or less.

FIG. 8C is a cross-sectional view of the substrate 110 when the groove is formed in the substrate using the cutting tip having the bottom surface with the inclination angle of 45°. The groove has the smallest size and width. Referring to the burr position graph, the rhombuses are concentrated on the outer side O of the groove. In particular, the rhombuses are concentrated within the distance between 0 μm and 150 μm, are concentrated even further to the outer side O of the groove than in the graph shown in FIG. 8B. Accordingly, the substrate 110 is highly likely to be broken within the distance between 0 μm to 150 μm. Referring to Table 1, burrs having a size of 0 μm to 50 μm account for 57.1%, and burrs having a size of 50 μm to 150 μm account for 35.4%. Therefore, the burr having a size of 150 μm or less accounts for 92.5%. In other words, when the groove is formed in the substrate using the cutting tip having the bottom surface with the inclination angle of 45°, the size of the burr can be reduced to 150 μm or less.

That is, as the inclination angle increases, the substrate 110 is more likely to be broken at a position closer to the breaking point formed on the outer side of the groove, and thus the size of the burr can be reduced.

Figure 8D:
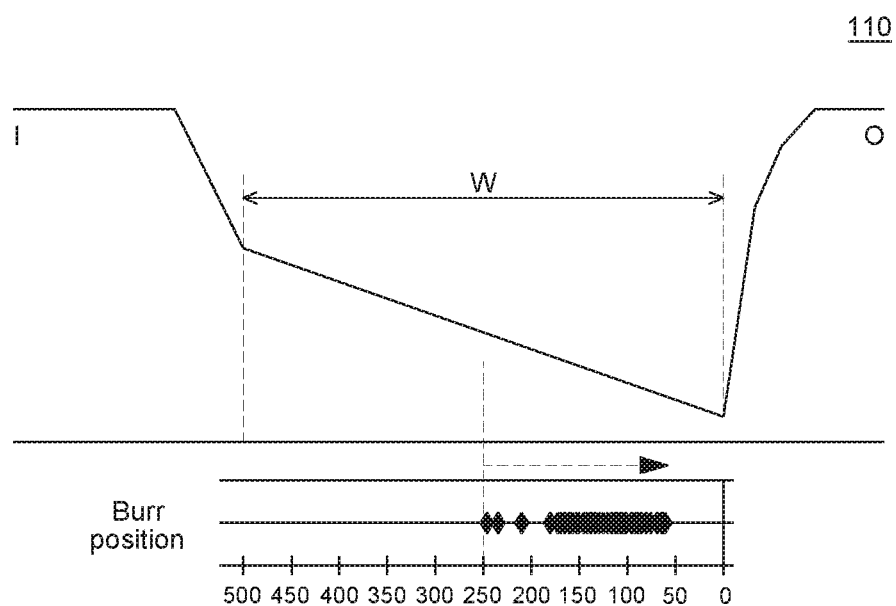
FIG. 8D is a cross-sectional view of a substrate when a groove is formed in the substrate using a cutting tip having the bottom surface with the inclination angle of 15° like FIG. 8B but with a larger width W of the bottom surface, along with the positions of burrs when the core substrates have been removed.

FIG. 8D is a cross-sectional view of a substrate when a groove is formed in the substrate using a cutting tip having the bottom surface with the inclination angle of 15° like FIG. 8B but with a larger width W of the bottom surface, along with the positions of burrs when the core substrates have been removed. The width of the bottom surface of the cutting tip is 500 μm. The thickness of the substrate 110 is smaller on the outer side than in the inner side within the width W. The groove formed in the substrate 110 by the cutting tip with the third inclined surface has an angle larger than 15° from the position distant from the outer side of the groove by 500 μm, such that the thickness of the substrate 110 is drastically increased. As a result, it is possible to prevent the portion of the substrate 110 distant from the outer side of the groove by 500 μm from being broken. And, since the width W of the bottom surface of FIG. 8D is larger than that of FIG. 8B, the breaking position of the substrate 110 may be larger. Referring to the burr position graph, the rhombuses are concentrated on the outer side O of the groove. In particular, the rhombuses are concentrated within the distance between 0 to 250 μm. Accordingly, the substrate 110 is highly likely to be broken within the distance between 0 μm to 250 μm. That is, the size of the burr may be 250 μm or less. Referring to Table 1, burrs having a size of 0 μm to 50 μm account for 50%, and burrs having a size of 50 μm to 150 μm account for 47%. Therefore, the burr having a size of 150 μm or less accounts for 97%.

Referring to Table 1, to form the burr having a size of 50 μm or less, the cutting tip having the bottom surface with the width of 300 μm and the inclination angle of 45° exhibited the highest probability of 57.1%, followed by the cutting tip having the bottom surface with the width of 300 μm and the inclination angle of 15°, followed by the cutting tip having the bottom surface with the width of 500 μm and the inclination angle of 15°, and followed by the cutting tip having the flat bottom surface.

That is, the size of the burr may be approximately half the width W of the bottom surface when the cutting tip with inclined bottom surface is used. The size of the burr may increase with the width W of the bottom surface, and thus it is more effective to reduce the size of the width W of the bottom surface. In addition, by using the cutting tip having the inclined bottom surface, it is possible to move the position where the substrate 110 is to be broken more to the outer side O of the groove. Accordingly, by forming the groove with the cutting tip having an inclined surface, it is possible to reduce the size of the burr while improving the yield. Also, it is possible to reduce the possibility that burrs are created in the groove, compared to a method without the cutting tip.

Also, the groove formed by the cutting tip that is not flat with respect to the contact surface of the substrate can reduce burrs.

The inclination angle of the first inclined surface is not limited to the inclination angles described in FIGS. 8A to 8D. That is, the inclination angle of the first inclined surface may be larger than 0° and less than 90°. In detail, the inclination angle of the first inclined surface may be 15°, 30°, 45°, 50°, 60°, etc.

Figure 9:
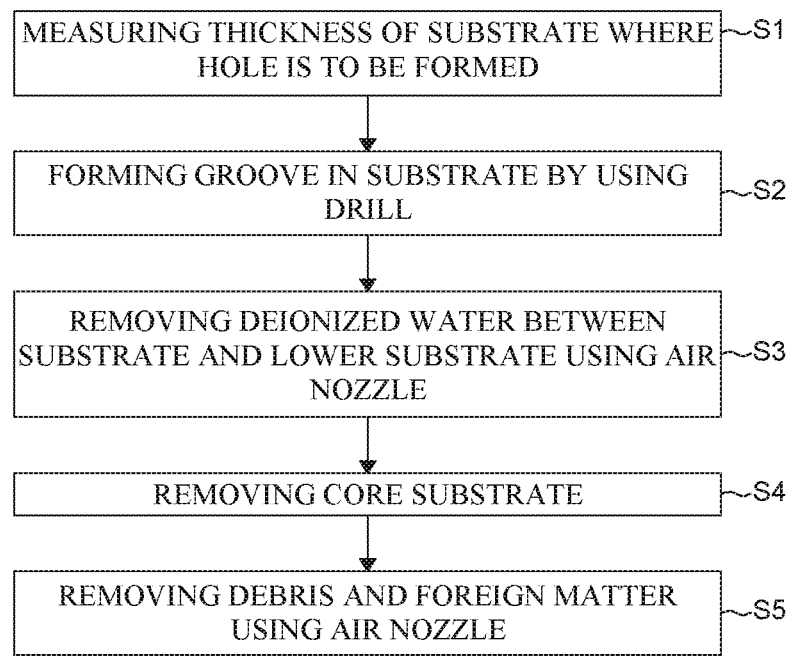
FIG. 9 is a flowchart illustrating steps of forming a groove in a substrate.

FIG. 9 is a flowchart for illustrating steps of forming a groove in a substrate.

Although the method of forming a hole in a substrate has been described above generally, a method for solving defects that may occur during the process is described in more detail.

The method for forming a hole largely includes two steps. That is, the method includes steps of forming a groove, and removing the groove.

First, to form a groove, the thickness of the substrate is measured to calculate the depth of the groove (step S1). In order to measure the thickness of the substrate, a laser displacement sensor or a confocal sensor may be used. By additionally measuring the height to the substrate using the apparatus for processing the substrate, the actual depth to be drilled can be calculated. The depth of the groove in the substrate depends on the thickness of the substrate and the size of the hole. The depth of the groove may be approximately 80% to 99% of the substrate thickness. The depth of the groove may be thick enough not to damage the second substrate or the layers such as the black matrix formed on the second substrate during the drilling. The thickness of the grooved portion of the substrate may be, but is not limited to, approximately 20 µm or less.

Subsequently, after the depth of the groove is calculated according to the thickness of the substrate, the groove is formed in the substrate using the drill (step S2).

A first method for forming the groove is to form the groove to a desired depth using one type of cutting tip at a time. There are advantages that the process time is not long and the equipment setting is simple.

A second method is to form the groove with one type of a cutting tip several times. A third method is to form a groove with two or more types of cutting tips. In this case, the inclination angle of the bottom surface of the cutting tip used in a subsequent step may be increased compared to the inclination angle of the bottom surface of the cutting tip used in a previous step. By using the cutting tip having a large inclination angle, the range of the breaking points of the substrate can be narrowed and the size of the burr can be reduced. The bottom surface of the cutting tip to be used first may be flat or have a low inclination such as 10°. The position of the burr may be influenced by the shape of all cutting tips used to form the groove. That is, if the bottom surface is flat, the breaking points may be scattered. Therefore, the bottom surface of the cutting tip used first would better to have an inclination angle.

According to the method for forming the groove via several steps, the groove is formed while advancing the drill once, and foreign matter generated during drilling can be removed at the time of backward movement. Accordingly, the size of the burr can be reduced and material that can cause contamination of the black matrix formed on the lower substrate can be removed.

When the groove is formed in the substrate using the drill, the drill rotates at a very high speed to grind the substrate. As a result, the frictional heat is very high. Such frictional heat may cause deformation and cracking of the substrate. Accordingly, deionized water may be sprayed while forming the groove with the drill to reduce the frictional heat.

After forming the groove in the substrate, the substrate is subjected to a step of removing the core substrate inside the groove (step S4). The step of removing the core substrate may include using a breaking tool to apply a pressure to the groove formed in the substrate to induce a crack of the substrate, and then attaching a tape to the core substrate to remove the core substrate. However, the step of inducing a crack on the substrate may be omitted depending on the thickness of the groove formed in the substrate and the inclination of the bottom surface of the cutting tip. And, the core substrate may be removed by slightly pressing the core substrate with the tape to induce a crack. The step of inducing the crack on the substrate may be omitted the thickness of the grooved portion of the substrate is approximately 20 µm or less, for example.

Even after the step of inducing a crack on the substrate to remove the core substrate, the core substrate may remain unremoved. This happens because the deionized water sprayed during the drilling permeates between the substrate and the lower substrate, such that strong adhesion is formed between the substrate and the lower substrate. Therefore, a step (step S3) of removing the deionized water between the substrate and the lower substrate by using an air nozzle may be carried out before removing the core substrate. By removing some deionized water from the panel, the adhesion force between the substrate and the lower substrate is reduced to form a gap or a space between the substrate and the lower substrate. Therefore, it is not necessary to perform a rework process as the core substrate is not removed. Therefore, the yield can be improved.

In addition to the failure of removing the core substrate, debris or burrs of the substrate, foreign materials, etc., may be generated in the processes of inducing the crack and removing the substrate. Therefore, a step of removing the debris and foreign matter from the substrate by using the air nozzle (step S5) may be carried out after removing the core substrate. Since the air nozzle has a lower pressure than a water jet, it is possible to avoid the black matrix formed on the lower substrate from being damaged. In addition to the air nozzle, debris or foreign matter may be removed from the substrate by vacuum-sucking or using a tape.

After removing debris or foreign matter, the panel is subjected to processes of cleaning and inspecting. In this case, a defect that a part of the substrate at the periphery of the hole is broken may be found. When the portion of the substrate at a periphery of the hole is broken, the rigidity of the substrate becomes weak, causing a crack in the substrate. Therefore, in case a part of the substrate is broken at the location from which the hole is tapered, the broken part may be polished or grinded by using a cutting tip in which a smaller angle than the angle of the second inclined surface of the cutting tip, such that the surface can become smooth. That is, the broken portion does not come out of the hole, but is included as a part of the hole, so that a crack cannot be induced in the substrate. In this case, the angle of the outer surface of the cutting tip may be, but is not limited to, 45° or less.

In addition, in case a part of the substrate at the periphery of the hole is broken, a helical motion drilling method may be used to solve it. In the step of forming the groove in the substrate, the drilling is performed in a helical shape, such that the outer diameter of the groove is expanded. By doing so, the grinding at the position from which the substrate is tapered is reinforced, to solve the defect that the substrate is broken. For example, the groove may be formed by extending about 10 µm at the upper, lower, left, and right sides but is not limited thereto.

The embodiments of the present disclosure can also be described as follows:

According to an embodiment of the present disclosure, a cutting apparatus for forming a hole in a substrate comprises a rotatable body, and a cutting tip at an end of the body. The cutting tip having an inner surface, an outer surface, and a bottom surface between the inner surface and the outer surface, the bottom surface having an acute angle with respect to a contact surface of the substrate, when the body is positioned perpendicular to the contact surface of the substrate, to allow formation of a groove in the substrate. Accordingly, it is possible to reduce the size of debris of the substrate that may be created during a process of removing a core substrate inside the groove formed in the substrate.

According to one or more embodiments, the cutting apparatus for forming a hole in the substrate may further include an inclined surface that extends from an inner edge of the bottom surface toward the inner surface, the inclined surface having an inclination angle that is larger than an inclination angle of the bottom surface.

According to one or more embodiments, the cutting tip may further include a recessed surface that extends from an outer edge of the bottom surface toward the outer surface, and may form a recess between the bottom surface and the outer surface.

According to one or more embodiments, the cutting tip may further include one or more gaps along a circumference of the cutting tip, through which debris of the substrate may exit during a substrate grinding process, the one or more gaps extending between the outer surface and the inner surface, and an inner recess at least partially delimited by the inner surface the cutting tip, the inner recess may accommodate the debris.

According to one or more embodiments, the cutting tip may be to reduce a formation of burrs at the groove.

According to another embodiment of the present disclosure, an apparatus for processing a substrate for forming a groove in a substrate comprises a cutting unit for forming a groove in the substrate. The cutting unit includes a first inclined surface and a second inclined surface, and an end portion at an intersection of the first inclined surface and the second inclined surface, in operation, the end portion contacts the substrate with the cutting unit positioned perpendicular to the substrate. Accordingly, it is possible to reduce the size of debris of the substrate that may be created during a process of removing a core substrate inside the groove formed in the substrate.

According to one or more embodiments, the first inclined surface may be positioned on an inner side of the cutting unit, and the first inclined surface, in operation, may form an acute angle with respect to the substrate.

According to one or more embodiments, the second inclined surface may be inclined toward the outer side of the cutting unit. And the second inclined surface, in operation, may form an acute angle with respect to the substrate.

According to one or more embodiments, the apparatus may further include a third inclined surface positioned on the inner side of the cutting unit. The third inclined surface may extend from the first inclined surface and have an inclination angle that is larger than an inclination angle of the first inclined surface.

According to one or more embodiments, the apparatus may further include a fourth inclined surface extending from the second inclined surface and forming a smooth curve with the second inclined surface.

According to one or more embodiments, the cutting unit may comprise a plurality of arc-like cutting portions to form a circular groove in the substrate.

According to one or more embodiments, the cutting unit may be configured to reduce a formation of burrs at the groove.

According to yet another embodiment of the present disclosure, a display device comprises a substrate having a display area and a non-display area, and at least one opening in at least one of the display area and the non-display area. The opening is formed by a cutting tip of an apparatus for processing a substrate, and the cutting tip includes a shape that, in operation, forms an acute angle with respect to a contact surface of the substrate. Accordingly, it is possible to reduce the size of the debris of the substrate that may be created inside the hole, and to reduce the thickness of the display device by inserting a module device into the hole.

According to one or more embodiments, the cutting tip may include a first inclined surface that is inclined toward an inner side of the cutting tip, and a second inclined surface that is inclined toward an outer side of the cutting tip, and the opening is formed by an end portion of the cutting tip at an intersection of the first inclined surface meets the second inclined surface at the contact surface of the substrate.

According to one or more embodiments, the opening may be formed by the cutting tip with the first inclined surface having an angle larger than 0° and less than 90° with respect to the contact surface of the substrate.

According to one or more embodiments, the cutting tip may further include a third inclined surface extending from the first inclined surface and having an inclination angle than an inclination angle of the first inclined surface. And the opening may be further formed by the third inclined surface of the cutting tip.

According to one or more embodiments, the opening may accommodate at least one of a camera, a microphone, a speaker, a sensor module, an illumination module, an infrared ray module, a button, a driving chip, and other input and output devices.

According to one or more embodiments, the display device may comprise at least one of a liquid-crystal display panel, an organic light-emitting display panel, and an electrophoretic panel.

According to one or more embodiments, the cutting tip may be configured to reduce a formation of burrs at the opening.

According to yet another embodiment of the present disclosure, a method for forming a hole in a substrate comprises measuring the thickness of the substrate, forming a groove in the substrate by using a drill, and removing a portion of the substrate inside the groove. The groove is formed by the drill included a cutting tip that has a non-flat bottom surface. Accordingly, it is possible to reduce the size of debris of the substrate that may be created inside the hole.

According to one or more embodiments, the forming the groove in the substrate may include spaying deionized water onto the substrate to remove heat resulted from the drilling.

According to one or more embodiments, the thickness of the grooved portion of the substrate may be 20 μm or less.

According to one or more embodiments, the forming the groove in the substrate by using the dill may include at least one step of forming the groove.

According to one or more embodiments, when the groove is formed via several steps, wheels having different shapes may be used.

According to one or more embodiments, during the step of removing the substrate, a layer having a thickness may be formed on a position corresponding to the hole area on a transfer table where the substrate is placed.

According to one or more embodiments, after removing the substrate, the method may further include removing the debris of the substrate by using an air nozzle.

According to one or more embodiments, after removing the substrate, the method may further include polishing a broken portion of the substrate that may occur on the outer side of hole during forming the groove by a cutting tip having a different angle from that used in forming the groove.

According to one or more embodiments, the method of forming a groove in a substrate by a substrate processing method may further include disposing a lower substrate on which a black matrix is formed under the substrate, and removing deionized water between the substrate and the lower substrate by using an air nozzle after the step of forming the groove.

Thus far, embodiments of the present disclosure have been described in detail with reference to the accompanying drawings. However, the present disclosure is not limited to the embodiments, and modifications and variations can be made thereto without departing from the technical idea of the present disclosure. Accordingly, the embodiments described herein are merely illustrative and are not intended to limit the scope of the present disclosure. The technical idea of the present disclosure is not limited by the embodiments. Therefore, it should be understood that the above-described embodiments are not limiting but illustrative in all aspects. The scope of protection sought by the present disclosure is defined by the appended claims and all equivalents thereof are construed to be within the true scope of the present disclosure.

The various embodiments described above can be combined to provide further embodiments. These and other changes can be made to the embodiments in light of the above detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A cutting apparatus for forming a hole in a substrate, comprising:

a cutting tip, the cutting tip having a first, second, third, and fourth inclined surface, wherein the first inclined surface and the second inclined surface meet to form a tip having an acute angle formed based on the first and second inclined surface, the third inclined surface extends from the first inclined surface and the fourth inclined surface extends from the second inclined surface;

a first acute angle that the first inclined surface forms with a surface of the substrate;

a second acute angle that the second inclined surface forms with the surface of the substrate, the first acute angle is smaller than the second acute angle;

a third acute angle that the third inclined surface forms with the surface of the substrate, the third acute angle is larger than the first acute angle; and a fourth acute angle that the fourth inclined surface forms with the surface of the substrate, the fourth acute angle is smaller than the second acute angle, wherein a width of the first inclined surface as projected to the surface of the substrate is greater than a sum of a width of the second inclined surface as projected to the surface of the substrate and a width of the fourth inclined surface as projected to the surface of the substrate.

2. A cutting apparatus of claim 1, wherein a sum of the acute angle between the first and second inclined surface, the first acute angle, and the second acute angle is 180°.

3. A cutting apparatus of claim 1, wherein the cutting tip includes a plurality of sub-cutting tips spaced from each other to form a gap between the respective sub-cutting tips.

4. A cutting apparatus of claim 3, wherein the respective sub-cutting tip includes an arc-shaped cutting portion.

5. A cutting apparatus of claim 1, wherein a boundary portion between the second inclined surface and the fourth inclined surface has a recessed shape or a concave shape slightly bent toward an inner side of the cutting tip.

\* \* \* \* \*